(12) United States Patent
Lu et al.

(10) Patent No.: US 10,056,395 B2
(45) Date of Patent: Aug. 21, 2018

(54) METHOD OF IMPROVING LOCALIZED WAFER SHAPE CHANGES

(71) Applicant: MACRONIX INTERNATIONAL CO., LTD., Hsinchu (TW)

(72) Inventors: Chi-Pin Lu, Hsinchu (TW); Pei-Ci Jhang, New Taipei (TW); Fu-Hsing Chou, New Taipei (TW); Chih-Hsiung Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/290,470

(22) Filed: Oct. 11, 2016

(65) Prior Publication Data

US 2017/0287921 A1    Oct. 5, 2017

Related U.S. Application Data

(60) Provisional application No. 62/314,411, filed on Mar. 29, 2016.

(51) Int. Cl.
| | |
|---|---|
| *H01L 29/00* | (2006.01) |
| *H01L 27/11521* | (2017.01) |
| *H01L 27/11526* | (2017.01) |
| *H01L 29/04* | (2006.01) |
| *H01L 21/762* | (2006.01) |
| *H01L 21/02* | (2006.01) |

(Continued)

(52) U.S. Cl.
CPC .... *H01L 27/11521* (2013.01); *H01L 21/0273* (2013.01); *H01L 21/02164* (2013.01); *H01L 21/02282* (2013.01); *H01L 21/30604* (2013.01); *H01L 21/31111* (2013.01); *H01L 21/76224* (2013.01); *H01L 21/76802* (2013.01); *H01L 27/11526* (2013.01); *H01L 29/045* (2013.01); *H01L 29/0649* (2013.01); *H01L 29/36* (2013.01)

(58) Field of Classification Search
CPC . H01L 51/0072; H01L 51/56; H01L 51/0067; H01L 51/5012; C09K 11/06
USPC ........................................................ 257/506
See application file for complete search history.

(56) References Cited

U.S. PATENT DOCUMENTS

| | | |
|---|---|---|
| 6,897,084 B2 | 5/2005 | Binns et al. |
| 7,319,258 B2 | 1/2008 | Yang et al. |

(Continued)

FOREIGN PATENT DOCUMENTS

JP    2001185554 A  *  7/2001

OTHER PUBLICATIONS

Amon et al., "A highly manufacturable deep trench based DRAM cell layout with a planar array device in a 70nm technology," 2004 IEEE Int'l Electron Devices Meeting, IEDM Technical Digest, Dec. 13-15, 2004, pp. 73-76.

(Continued)

*Primary Examiner* — Andy Huynh
(74) *Attorney, Agent, or Firm* — Haynes Beffel & Wolfeld LLP

(57) ABSTRACT

A method of manufacturing an integrated circuit including forming trenches into the surface of a crystalline wafer and the trenches extending along a <100> lattice direction is disclosed. Such wafer can experience less deformation due to less stress induced when the trenches are filled using a spin-on dielectric material. Thus, the overlay issue caused by wafer shape change is resolved.

9 Claims, 15 Drawing Sheets

(51) Int. Cl.
*H01L 21/311* (2006.01)
*H01L 21/027* (2006.01)
*H01L 21/306* (2006.01)
*H01L 21/768* (2006.01)
*H01L 29/36* (2006.01)
*H01L 29/06* (2006.01)

(56) References Cited

U.S. PATENT DOCUMENTS

| | | | |
|---|---|---|---|
| 7,842,558 | B2 | 11/2010 | Juengling |
| 2006/0035437 | A1* | 2/2006 | Mitsuhira ......... H01L 21/76229 438/424 |
| 2009/0042363 | A1 | 2/2009 | Miyazaki et al. |
| 2009/0315096 | A1* | 12/2009 | Wei ................... H01L 21/76229 257/315 |
| 2013/0192303 | A1* | 8/2013 | Ryu ....................... G01N 21/17 65/29.12 |
| 2014/0027787 | A1 | 1/2014 | Gunjishima et al. |
| 2015/0228588 | A1 | 8/2015 | Koo et al. |

OTHER PUBLICATIONS

Khamankar et al., "An enhanced 90nm high performance technology with strong performance improvements from stress and mobility increase through simple process changes," 2004 Symp. on VLSI Technology, Digest of Technical Papers, Jun. 15-17, 2004, pp. 162-163.

Komoda et al., "Mobility improvement for 45nm node by combination of optimized stress and channel orientation design," 2004 IEEE International, Electron Devices Meeting, IEDM Technical Digest, Dec. 13-15, 2004, pp. 217-220.

Lee et al., "Analysis of Fine Bulk Micro Defects in Denuded Zone of Silicon Wafer," Abstract MA2010-02 2078, Oct. 10-15, 2010, 1 page.

Matsumoto et al., "Novel SOI wafer engineering using low stress and high mobility CMOSFET with <100>-channel for embedded RF/analog applications," 2002 In'l Electron Devices Meeting, IEDM San Francisco, CA, USA, Dec. 8-11, 2002, pp. 663-666.

Semi Int'l Stds. Program, Semi Draft Document 5441 Line Items Revision to Semi M1-0812 Specifications for Polished Single Crystal Silicon Wafers, Aug. 28, 2012, 69 pages.

Su et al., "Effects of Dislocation and Bulk Micro Defects on Device Leakage," SEMICON Taiwan, 2001 Sep. 17-19, 2001, 5 pages.

\* cited by examiner

METHOD OF IMPROVING LOCALIZED WAFER SHAPE CHANGES

RELATED APPLICATIONS

This application claims benefit of U.S. Provisional Patent Application No. 62/314,411 filed on 29 Mar. 2016, which application is incorporated by reference herein.

BACKGROUND

Technical Field

This technology is related to a method of manufacturing integrated circuits, particularly related to a method of using large wafers in the manufacture of integrated circuits.

Description of Related Art

For years, the silicon wafer has been used for manufacturing integrated circuits. A single wafer can be used to form a large number of integrated circuit die, reducing the average cost. In general, the trend in manufacturing has been to use larger and larger wafers. So, the sizes of the wafers have steadily increased so that advanced manufacturing lines now use wafers having a diameter of 300 mm or more.

Integrated circuit manufacturing involves depositing materials and etching materials in layers according to patterns defined by photolithographic masks and other patterning techniques. The alignment of the patterns on the different layers is critical for device performance and reliability. As the sizes of the features get smaller and smaller, the alignment margins become tighter and more difficult to meet.

Large wafers introduce another difficulty in the alignment problem because they do not remain perfectly flat, but rather bow during manufacturing. The bowing causes problems in the alignment and design of the masks. Furthermore, as the wafers are subject of a variety of processes to form the circuits, the amount of bowing can vary during the processing of a single wafer through the fabrication line.

For example, bowing is associated with the formation of thin films of different materials and thicknesses, which can induce tensile and compress stress/strain on the wafer.

Also, the bowing can be affected by the formation of trenches with high aspect ratios in dense patterns that are filled with various materials. For example, using spin-coating techniques can be used to fill high aspect ratio trenches, but as the spin on material is cured it can induce localized deformation, leading to bending or warping of the wafer. In circuits having a large number of aligned trenches, such as some kinds of memory devices, the problem of bowed wafers can be amplified.

It is seen that at technology nodes of 22 nm or smaller line widths, the bending or warping of the wafers can become a significant problem and lead to manufacturing failure. Also, because of the nature of the bending or warping, the wafer can have dish or bowl shape, which induces alignment errors in more than one direction, including radial errors that vary different amounts along different radii. Thus, the alignment errors due to the bowing are difficult to correct using the lithographic equipment.

Therefore, it is desirable to provide a method that is suitable for high density structures using large wafers, but reduces problems associated with bowing of the wafers.

SUMMARY

A manufacturing method is described comprising providing a crystalline wafer having a surface normal to a <100> lattice direction; forming a pattern of die on the surface of the wafer, the die having memory array regions and peripheral circuit regions; and forming a plurality of parallel trenches in the memory array regions, the parallel trenches in the plurality extending along a particular <100> lattice direction, equivalent to [100] and [010] lattice directions. As a result of the alignment of the trenches in a <100> lattice direction, the variation in bowing of the wafer is reduced.

The method can also comprise forming a plurality of peripheral circuit trenches in the peripheral regions, having aspect ratios that are smaller than the aspect ratios of the parallel trenches in the memory array region.

The method can further comprise filling the trenches in the plurality using a spin-on dielectric material. As the trenches in the plurality extend along the <100> lattice direction, the amount of bowing caused by the stress induced by the spin-on dielectric material is decreased.

In another embodiment of the technology, a thermal process is applied to control the oxygen concentration in the wafer to create a denuded zone below the wafer surface. Such wafer can exhibit less wafer deformation.

A semiconductor device is described herein comprising a substrate having an oxygen concentration ranging from 7 to 10 parts per million atoms (ppma) and a denuded zone substantially greater than 5 µm; a first dielectric formed over the substrate and a first semiconductor formed over the first dielectric; a first plurality of isolation structures in the substrate including a first insulating material in a first plurality of trenches extending along a <100> lattice direction in memory array regions, wherein the first plurality of trenches has a trench width W1; and s second plurality of isolation structures in the substrate comprises a second insulating material in a second plurality of trenches extending along the <100> lattice direction in peripheral circuit regions, wherein the second plurality of trenches has a trench width W2 and the trench width W1 is narrower than the trench width W2. The first insulating material in the first plurality of trenches in the memory array regions has a top surface higher than a top surface of the first dielectric. In one example, the first and second insulating materials can comprise the same material.

Other features, aspects and advantages of the technology described herein can be understood with reference to the figures, the detailed description and the claims set out below.

DETAILED DESCRIPTION

For the purposes of this description, the system of Miller indices is used to characterize a particular plane of atoms or a crystal face within the single crystalline structure, which is reviewed here for reference. Using the Miller index notation, numbers in parenthesis (100) represent a plane or surface; and numbers in curly brackets {100} represent a family of equivalent planes. Numbers in square brackets [100] represent a direction; and numbers in angle brackets <100> represent a family of equivalent directions. In a cubic crystal lattice, a direction [100] is normal to the surface (100).

Figure 1A:
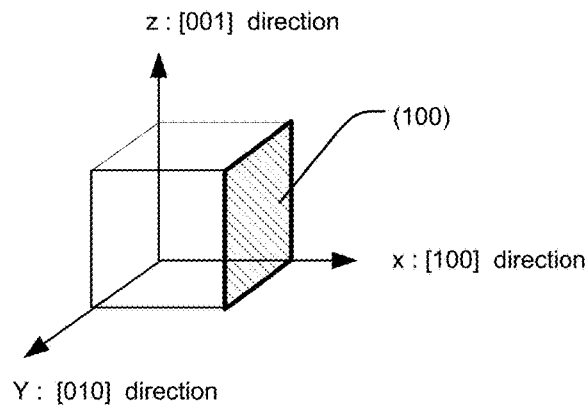
FIG. 1A illustrates a (100) lattice plane in a silicon crystalline lattice.
Figure 1B:
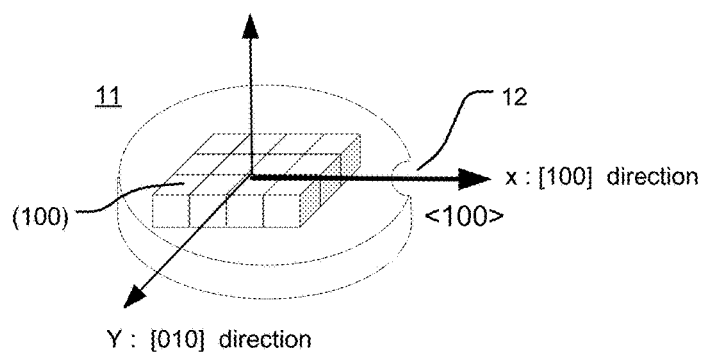
FIG. 1B relates the silicon crystalline lattice of FIG. 1A to a silicon wafer 11 having a notch oriented in a <100> lattice direction.
Figure 1C:
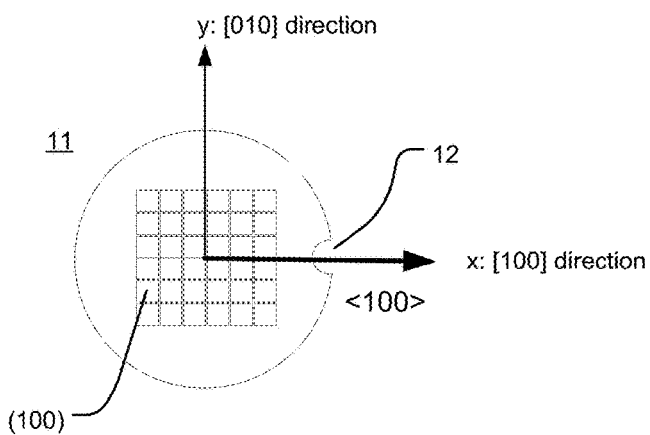
FIG. 1C illustrates a plan view of the wafer 11 having a notch oriented in a <100> lattice direction and having a surface in (100) lattice plane.

Referring to FIG. 1A, the shaded area indicates a (100) lattice plane in a cubic crystal lattice. FIG. 1B illustrates a silicon wafer 11 having a surface parallel to a (100) lattice plane illustrated in FIG. 1A and having an alignment notch 12 oriented in a [100] lattice direction. FIG. 1C is a plan view of the silicon wafer 11 of FIG. 1B. The alignment notch can be used by wafer handling equipment to orient the wafer lattice with processing equipment. Because of the symmetry of the cubic lattice, the (100) lattice plane is equivalent to the (010) and (001) lattice planes, collectively denoted as {100} lattice plane. Also, the [100] lattice direction is equivalent to the [010] and [001] lattice directions, collectively denoted as the <100> lattice direction. A wafer 11 having a surface oriented parallel to a (100) lattice plane, and a notch oriented in a [100] lattice direction, and is referred herein as a <100> wafer.

Figure 2A:
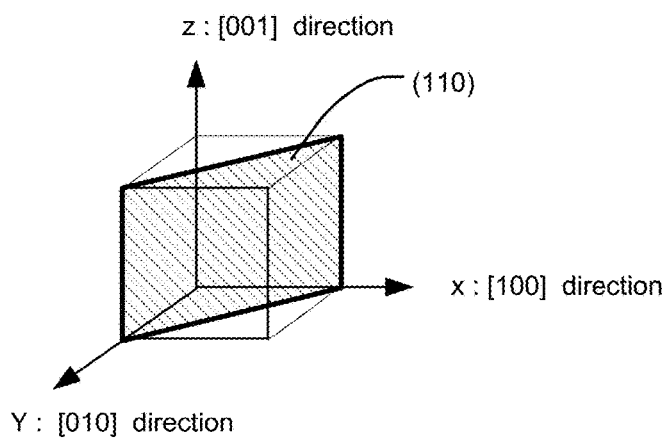
FIG. 2A illustrate a (110) lattice plane in a silicon crystalline lattice.
Figure 2B:
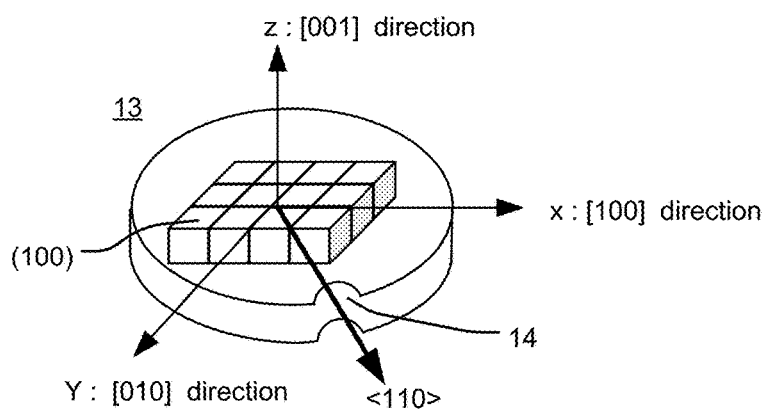
FIG. 2B relates the silicon crystalline lattice to a silicon wafer 13 having a notch oriented in a <110> lattice direction
Figure 2C:
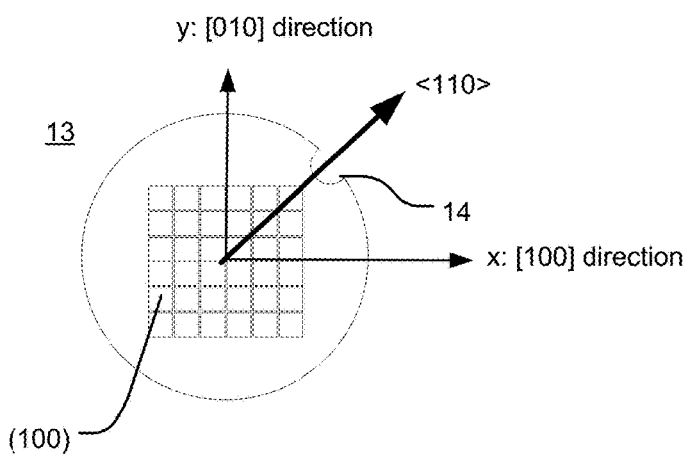
FIG. 2C is a plan view of the wafer 13 having a notch oriented in a <110> lattice direction and having a surface in (100) lattice plane.

Referring to FIG. 2A, the shaded area indicates a (110) lattice plane in a cubic crystal lattice. FIG. 2B illustrates a silicon wafer 13 having a surface parallel to a (100) lattice plane, and having an alignment notch 14 oriented in a [110] lattice direction which is also equivalent to the [101] and [011] lattice directions, collectively denoted as a <110> lattice direction. FIG. 2C is a plan view of the silicon wafer 13 of FIG. 2B. A silicon wafer 13 has a surface oriented parallel to a (100) lattice plane, and a notch oriented in a [110] lattice direction, and is referred herein as a <110> wafer.

The alignment notch can have different shapes. For example, in some silicon wafers the notch may be a flat edge, rather than a concave edge as illustrated in FIGS. 1C and 2C.

Figure 3:
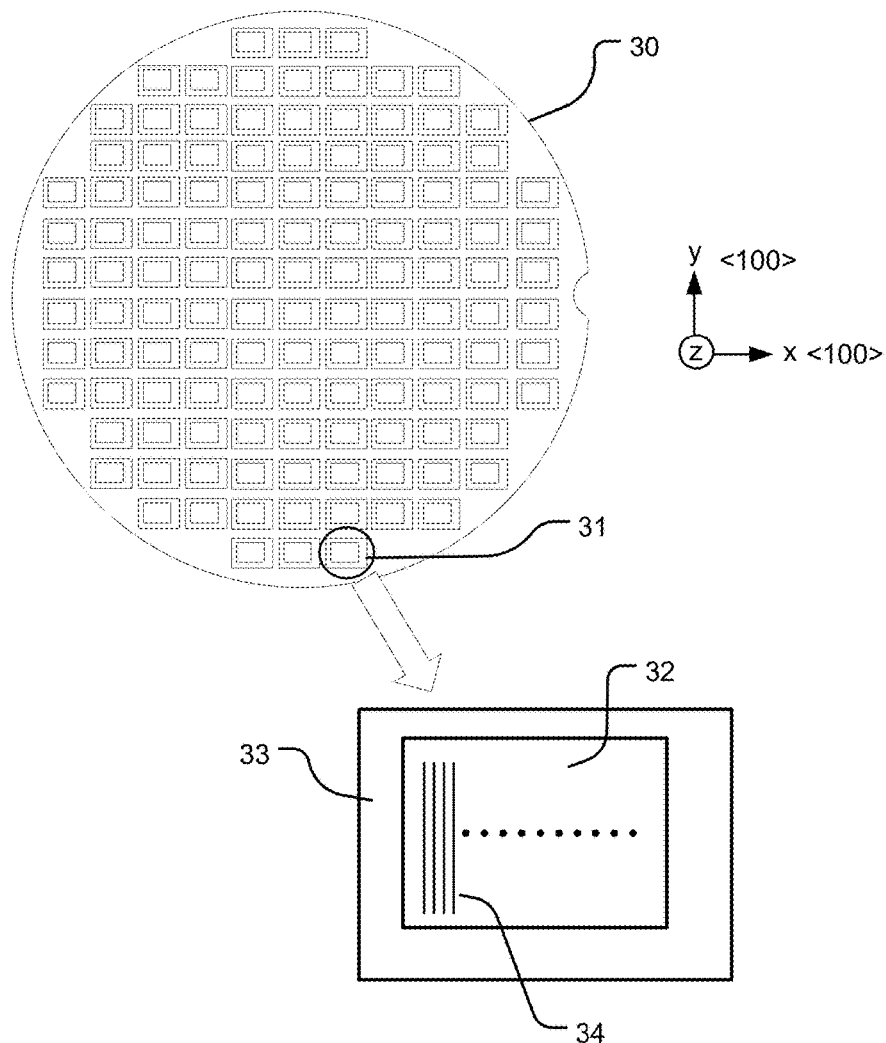
FIG. 3 illustrates an array of dies made using a <100> wafer.

FIG. 3 illustrates an array of die, including die 31, made using a <100> wafer 30. The wafer 30 has a surface in (100) lattice plane which is normal to a <100> lattice direction. The notch of the wafer 30 is oriented in a <100> lattice direction. As seen in the close-up figure of die 31, each die has a memory array region 32, also known as a dense region, and a peripheral circuit region 33, also known as a loose region. The area of the peripheral circuit region 33 can be on the order of 20-30% of a total area of each die in some types of memory circuits.

In the memory array region 32, memory cells can be arranged in columns and rows, with high aspect ratio trenches 34 in the wafer 30 between the columns or rows. There can be thousands of parallel trenches in the memory array region 32 of high density memory.

In a manufacturing process described herein, the parallel trenches in the memory array region 32 are aligned in a particular <100> lattice direction in the plane of the surface. The area of the memory array region 32 can be on the order of 70-80% of a total area of each die in some types of memory circuits.

In this embodiment, the memory array regions can cover as much as 70-80% of each die area and the peripheral circuit regions can cover the remaining 20-30% of each die area. In other embodiments, such as system on chip SOC devices, the percentage coverage can be much different. However, the area covered by the trenches and the stress induced during filling the trenches can be substantial, and induce significant variations in the bowing of the wafer.

The peripheral circuit regions can include the bit line decoders, word line decoders, sense amplifiers, state machines and so on which support operation of the memory array. The peripheral circuits can comprise MOS transistors, having active regions separated by trenches. The trenches in the peripheral circuit region 33 can have a larger trench width and shallower trench depth than the parallel trenches in the memory array region 32. Additionally, the trenches between MOS transistors of different circuits can have different sizes.

Detailed descriptions of embodiments of methods of manufacturing integrated circuits are provided with reference to FIGS. 4-13.

Figure 4:
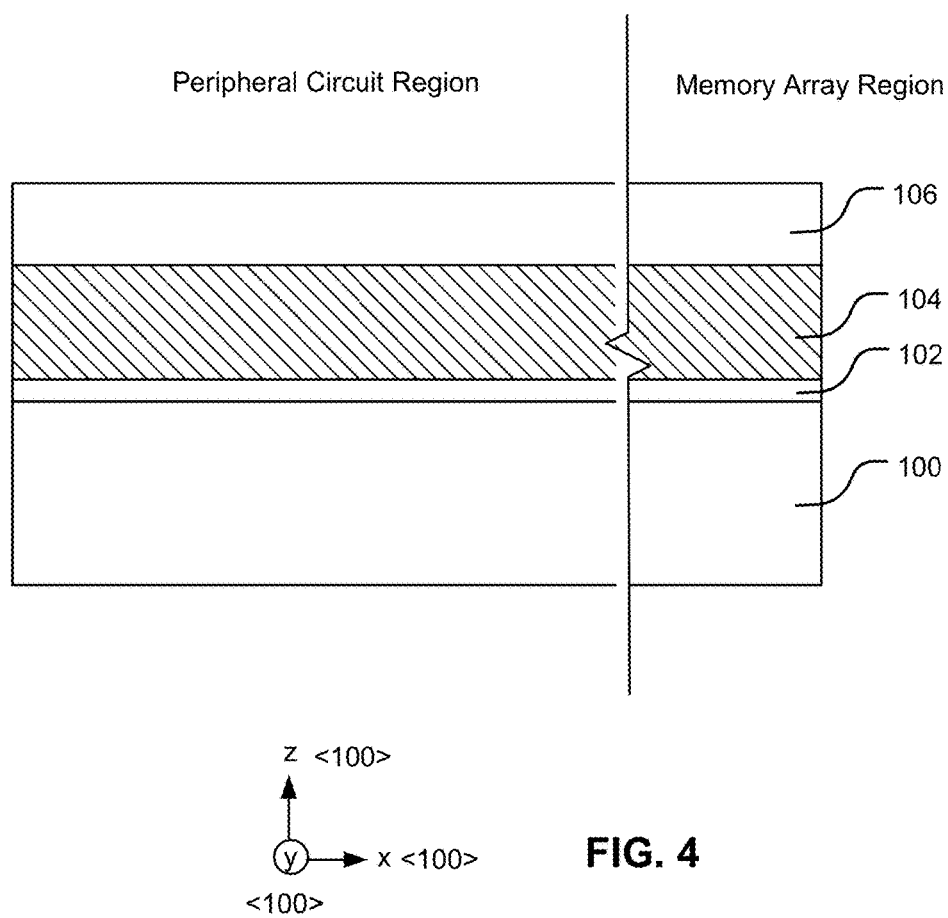
FIGS. 4 through 13 illustrate stages of an example process flow for manufacturing an integrated circuit on a <100> wafer.

FIGS. 4 through 13 illustrate stages of an example process flow for manufacturing an integrated circuit. The process includes using a <100> wafer in this example, although wafers with surfaces on other crystal orientation planes, and wafers with other types and locations of alignment marks can be used. Reference numerals used in FIG. 4 are generally applied in the following figures and not described again.

FIG. 4 is a cross-sectional view illustrating a stage of the process flow after forming a plurality of films on a silicon crystalline wafer 100 having a surface in (100) lattice plane. To form the structure shown in FIG. 4, the silicon crystalline wafer or substrate 100 is provided, and pre-clean and/or pre-treatment is applied to the substrate 100, followed by forming a silicon oxide film 102, a semiconductor film 104, and a hard mask 106 sequentially on the substrate 100.

The silicon crystalline wafer 100 is utilized as an integrated circuit die substrate and can be diced into a plurality of dies, and each die includes a peripheral circuit region and a memory array region.

The silicon oxide film 102 can be formed using chemical vapor deposition (CVD), thermal oxidation, or by other methods. The silicon oxide film 102 acts as the gate oxide of the transistors in the peripheral circuit regions, and acts as the tunnel oxide of the memory cells in the memory array regions, having a thickness less than 100 Å.

The semiconductor film 104 can comprise epitaxial silicon, polysilicon or other materials, acting for example as material of a floating gate in the memory array region. The hard mask 106 can comprise silicon nitride, silicon oxide and combinations thereof.

Figure 5:
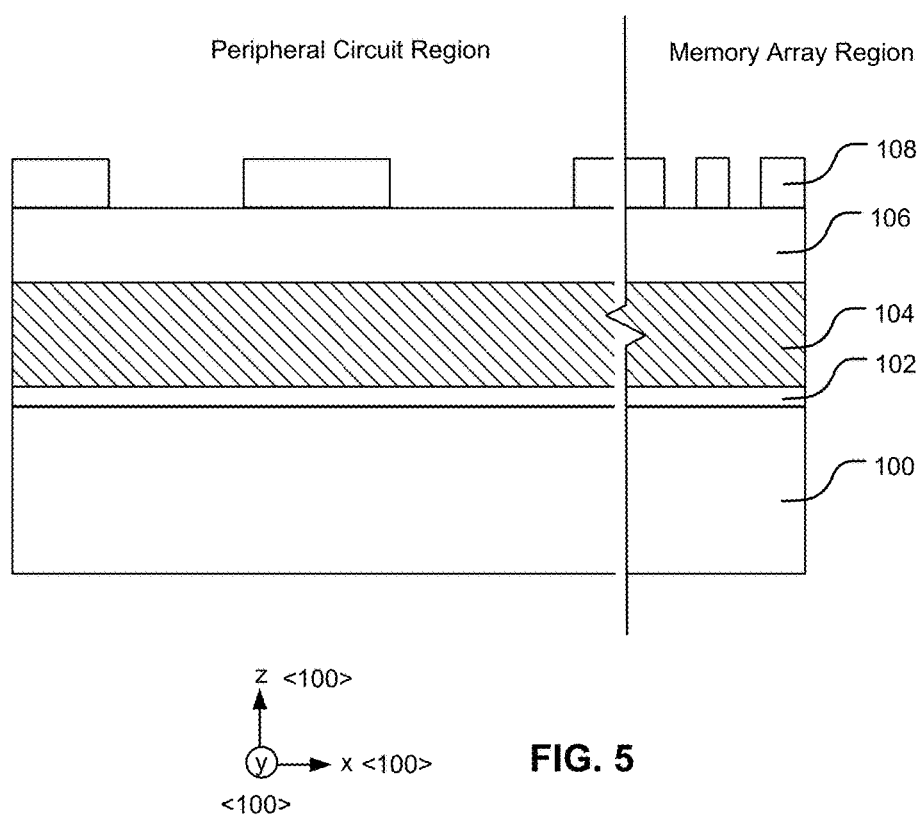

FIG. 5 is a cross-sectional view illustrating a stage of the process flow after formation of a mask 108 of photoresist. A layer of photoresist is formed on the hard mask 106, followed by patterning the layer of photoresist to form the mask 108. The mask 108 has openings in the memory array regions and in the peripheral circuit regions extending along a <100> lattice direction, equivalent to [100] or [010] lattice directions.

Figure 6:
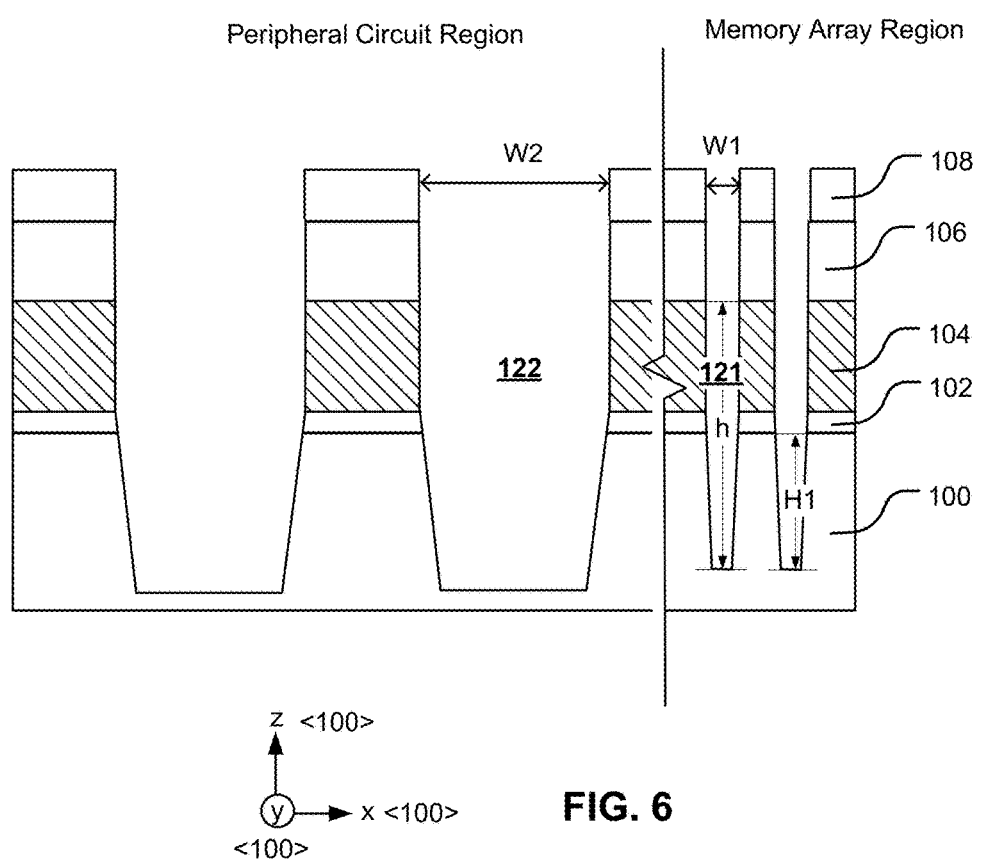

FIG. 6 is a cross-sectional view illustrating a stage of the process flow after forming a first plurality of parallel trenches in the memory array region and a second plurality of peripheral circuit trenches in the peripheral circuit region. The first plurality of parallel trenches in the memory array region, including trench 121, is created using the mask 108 of photoresist to etch through the silicon oxide film 102, the semiconductor film 104 and the hard mask 106, and etch a depth H1 of for one example, 200 nm, into the surface of the substrate 100. The trenches in the first plurality of parallel trenches in the memory array region can have an aspect ratio in a range of 10 to 15, for example. The aspect ratio is estimated by h/W1, where h is a trench depth of 350 nm and W1 is a trench width of 20 nm in this example. The first plurality of parallel trenches is aligned along a particular <100> lattice direction, equivalent to [100] or [010] lattice directions. In the silicon cubic lattice, the <100> directions have a number of atoms per unit length. This alignment of trenches on a <100> lattice direction is contrary to the accepted alignment orientation for trenches, because the etch rate on the lower density <110> lattice directions is higher.

Likewise, a second plurality of trenches in the peripheral circuit region, including a trench 122, is also created using the mask 108 to etch through the silicon oxide film 102, the semiconductor film 104 and the hard mask 106 and etch into the surface of the substrate 100. The second plurality of trenches has a trench width W2 wider than the first plurality of trenches, such that the second plurality of trenches has a lower aspect ratio than the first plurality of trenches. The second plurality of peripheral circuit trenches can also be aligned along the particular <100> lattice direction, and therefore be parallel with the first plurality of parallel trenches.

Figure 7:
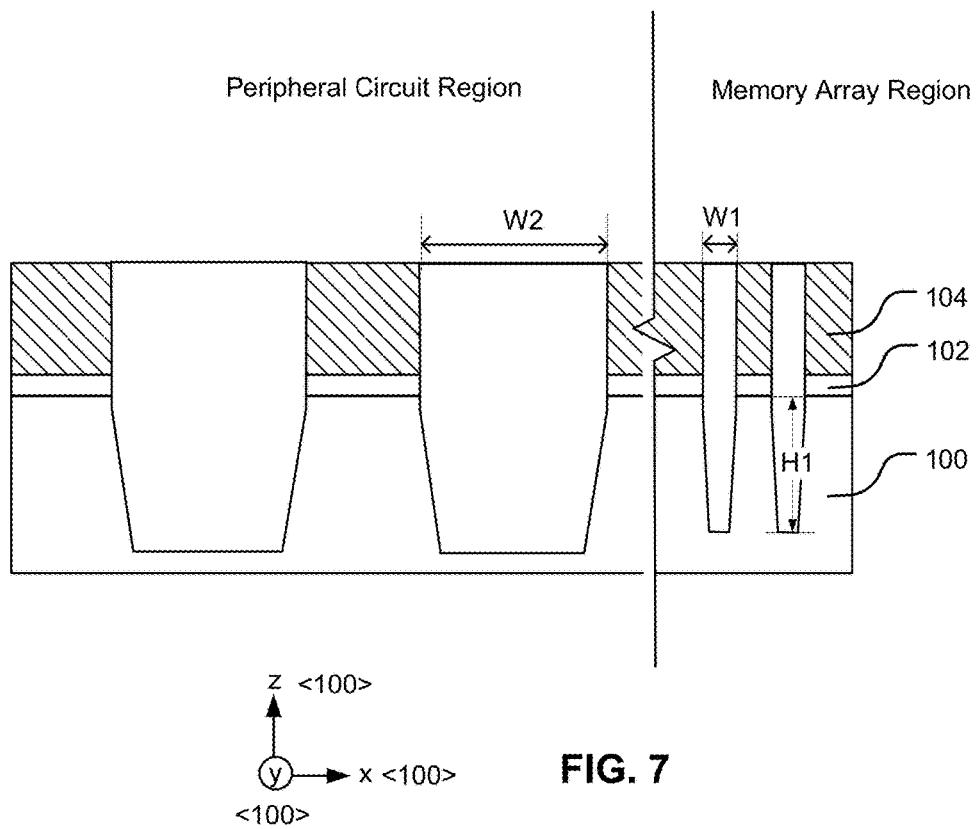

FIG. 7 is a cross-sectional view illustrating a stage of the process flow after applying a fill step. After the mask 108 (in FIG. 6) is removed, the first and second pluralities of trenches are filled with a flowable dielectric material referred to as spin-on dielectric (SOD), using spin coating techniques. One class of SOD is known as spin-on glass (SOG).

A SOD material can comprise perhydrosilazane (PHPS), silicon oxide, and silicon oxynitride. Due to the high aspect ratio of the trenches in the first plurality, the flowable dielectric material can be applied as a liquid so as to completely fill the trenches, even those with high aspect ratio, and then can be cured to form the trench isolation (STIs) structures.

For example, while applying the spin-on dielectric (SOD), for example, on the substrate 100, a curing process can include baking, for the purpose of removing the solvent of the SOD, at a temperature from 135° C. to 165° C., preferably at 150° C., for a period of time, followed by three phases to cure the material. In the first phase used to eliminate impurities, the SOD cures with steam at a temperature from 250° C. to 350° C., preferably at 300° C., for 30 minutes. In a second phase used for solidifying the silicon oxide, the SOD cures with steam at a temperature from 250° C. to 350° C., preferably at 300° C., for 30 minutes, and goes on to cure with steam at an elevated temperature from 450° C. to 550° C., preferably at 500° C., for 30 minutes, and then cures with nitrogen at a temperature from 800° C. to 900° C., preferably at 850° C., for 30 minutes. In the third phase of densifying the silicon oxide, the SOD cures with nitrogen at a temperature from 800° C. to 900° C., preferably at 850° C., for 30 minutes.

The volume of the SOD can be shrunk up to 25% when the curing process is completed. As the trench width W2 of the second plurality of trenches is wider than the trench width W1 of the first plurality of trenches, the shrinkage effect will cause an uneven stress over the substrate 100, which causes deformation of the substrate 100, such as warping or bending. However, forming the trenches in the first and second pluralities extending along the <100> lattice direction can reduce the shrinkage impact, and therefore, the substrate can render reduced deformation.

In this embodiment, the SOD completely fills both the first and second pluralities of trenches. In another embodiment, the SOD completely fills only the first plurality of trenches and partially fills the second plurality of trenches. An insulating material is deposited to fill the second plurality of trenches using chemical vapor deposition (CVD), atomic layer deposition (ALD), physical vapor deposition (PVD), low-pressure chemical vapor deposition (LPCVD) or high density plasma chemical vapor deposition (HDP-CVD).

Next, a CMP process can be applied to expose the top of the semiconductor film 104.

Figure 8:
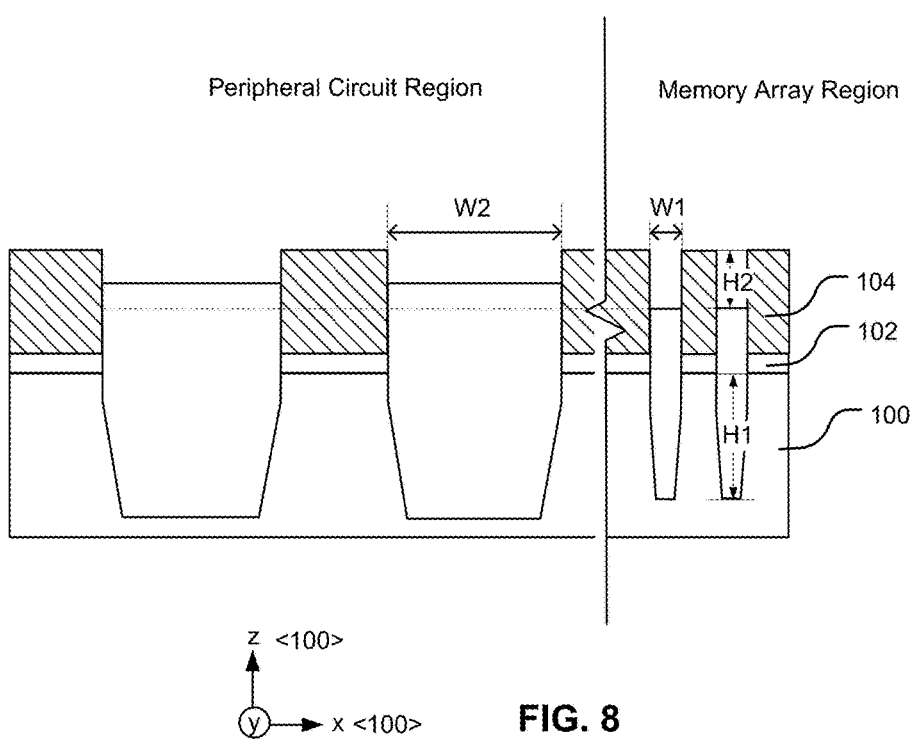

FIG. 8 is a cross-sectional view illustrating a stage of the process flow after removing portions of the dielectric material in the first and second pluralities of trenches. A dry etch process can be applied to remove the dielectric material, i.e. the SOD in this embodiment, on the top of the trenches in the first and second pluralities, and a recess depth H2 is formed in the first plurality of trenches in the memory array region. If the recess depth H2 is too small, the gate coupling ratio decreases, but if the recess depth H2 is too large, the tunnel oxide (silicon oxide film 102) is prone to damage. In this example, the recess depth H2 is about half of the thickness of the semiconductor film 104, and the ratio H1/H2 is about 3 to 4. The top surface of the remainder of the SOD in the first plurality of trenches is higher than the top surface of the silicon oxide film 102.

With the recess process, the top surface of the remainder of the SOD in the second plurality of trenches is higher than the top surface of the remainder of the SOD in the first plurality of trenches.

Figure 9:
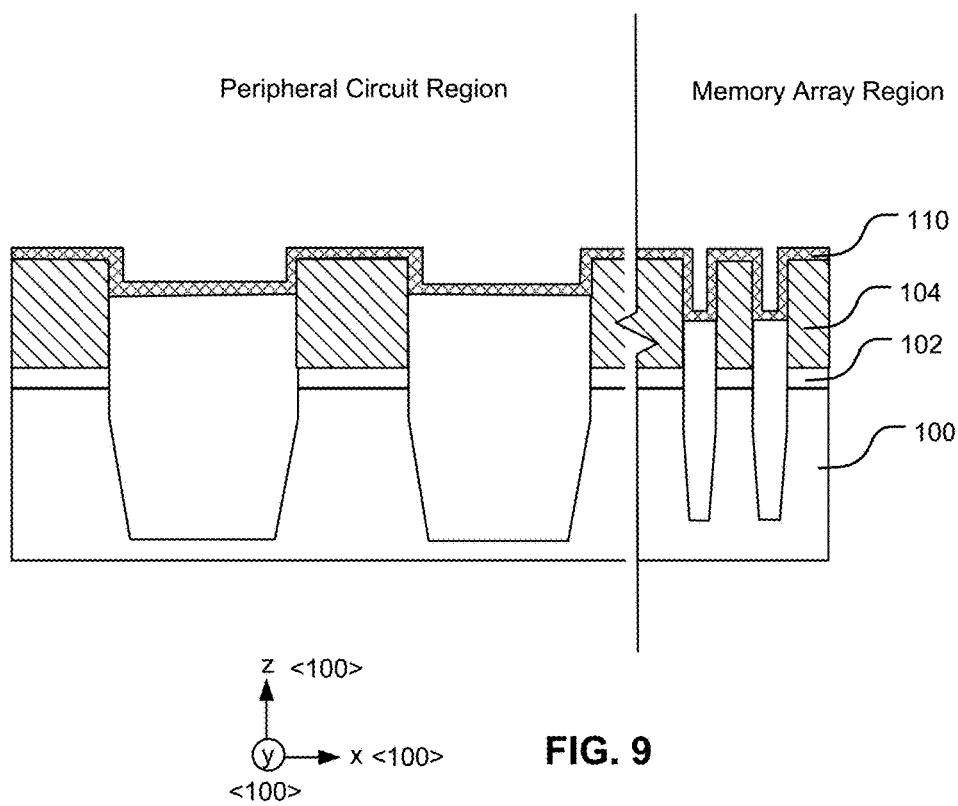

FIG. 9 is a cross-sectional view illustrating a stage of the process flow after formation of an ONO composite layer 110 over the substrate 100. The ONO composite layer 110 can comprise a first silicon oxide layer, a silicon nitride layer, and a second silicon oxide layer sequentially and conformally deposited using, for example, low-pressure chemical vapor deposition (LPCVD).

The first silicon oxide layer of the ONO composite layer 110, formed on the trenches in the first and second pluralities and on the semiconductor film 104, can have a thickness of about 30 Å to 40 Å. The silicon nitride layer of the ONO composite layer 110 formed on the first silicon oxide layer can have a thickness about 50 Å to 60 Å. The second silicon oxide layer of the ONO composite layer 110 formed on the silicon nitride layer can have a thickness about 60 Å to 70 Å. Other materials may be employed as replacement of the ONO composite layer 110, for example, high-κ materials like aluminum oxide of 150 Å.

Figure 10:
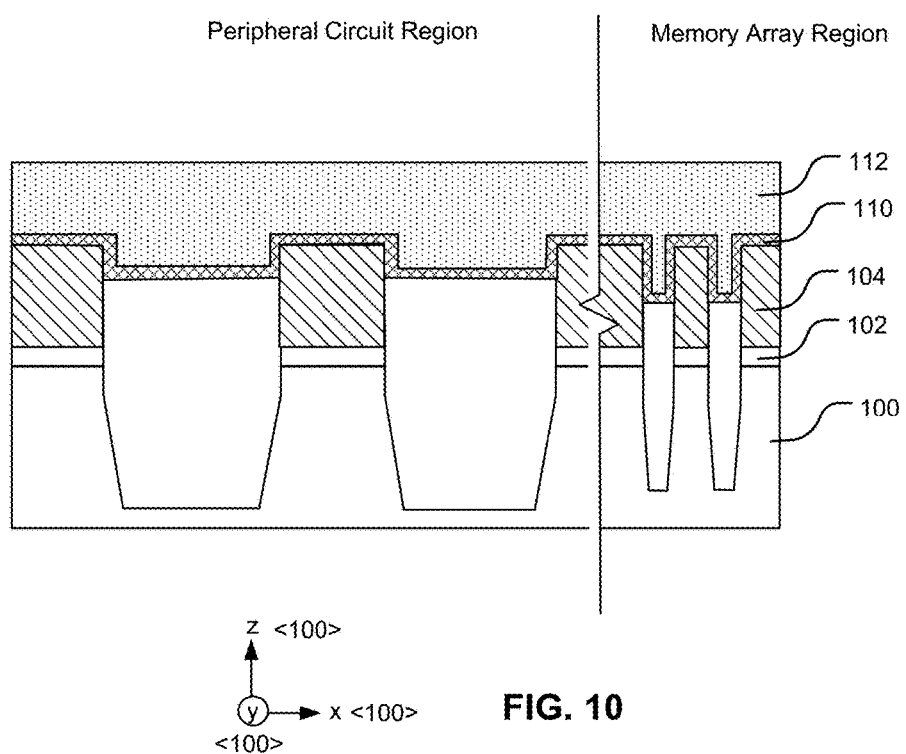

FIG. 10 is a cross-sectional view illustrating a stage of the process flow after forming a second semiconductor film 112 on the ONO composite layer 110. The second semiconductor film 112 can comprise epitaxial silicon, polysilicon, doped polysilicon, or other conductive materials, and acts as the control gate in the memory array region.

Figure 11:
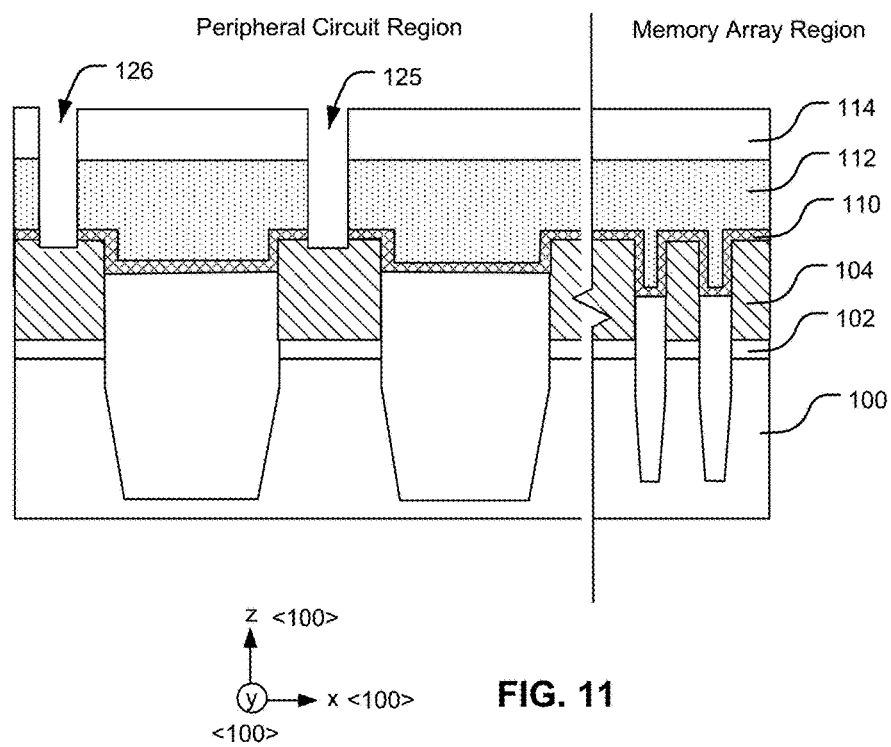

FIG. 11 is a cross-sectional view illustrating a stage of the process flow after formation of vias through the second semiconductor film 112 and the ONO composite layer 110, which is also known as IVG photo step. A layer of photoresist is formed on the second semiconductor film 112, followed by patterning the layer of photoresist to form the mask 114. A plurality of vias (e.g. 125, 126) in the peripheral circuit region is created using the mask 114 to etch through the second semiconductor film 112 and the ONO composite layer 110 and stop at the semiconductor film 104 between the trenches in the peripheral circuit region.

As mentioned previously, forming trenches extending along the <100> lattice direction can reduce the deformation of the substrate 100, which in turn improves the alignment accuracy of IVG photo step. Therefore, the vias (e.g. 125, 126) can be formed on the semiconductor film 104.

Figure 12:
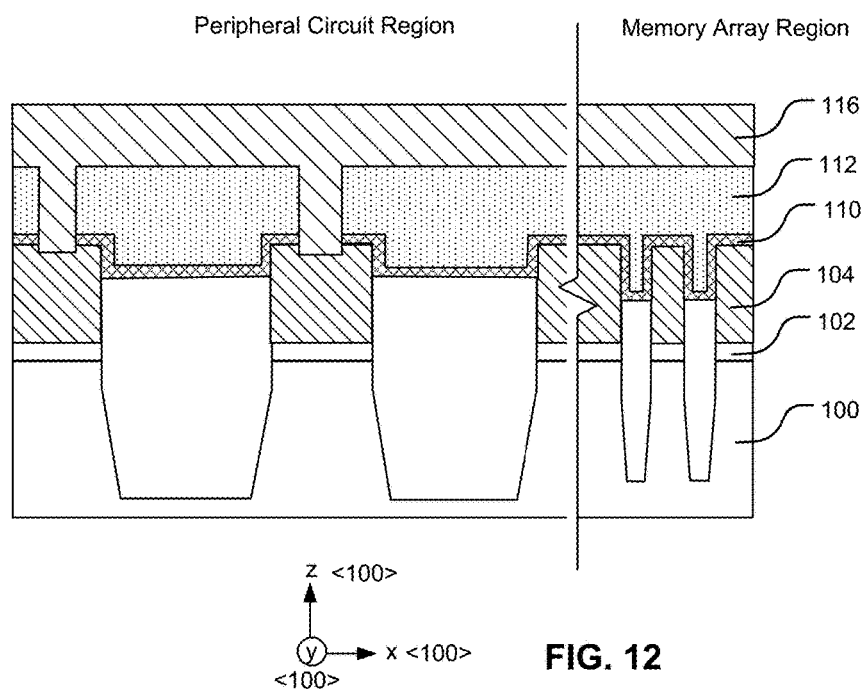

FIG. 12 is a cross-sectional view illustrating a stage of the process flow after deposition of a third semiconductor film 116. The third semiconductor film 116 is deposited on the second semiconductor film 112 and fills the plurality of vias in the peripheral circuit region, such that the semiconductor film 104 is electrically connected to the second and third semiconductor films 112, 116 and acts as a gate of MOS transistor in the peripheral circuit region. Under the gate is a gate oxide, followed by silicon substrate 100 that acts as a channel.

If the alignment accuracy of the mask for vias (e.g. 125, 126 shown in FIG. 11) is influenced by the deformation, in the worst case scenario, the vias may be formed on the trenches instead of on the semiconductor film 104. Then the third semiconductor film 116 cannot be electrically connected to the semiconductor film 104, which causes manufacturing failure. As such, the MOS transistors in the peripheral circuit region cannot be operated.

In the memory array region, the second and third semiconductor films 112, 116 act as a control gate, which is a segment of a word line, and the semiconductor film 104 acts as a floating gate. In this example, the control gate covers the top and sides of the floating gate and is insulated from the floating gate by the ONO composite layer 110. Under the floating gate is a tunnel oxide, followed by silicon substrate 100 that acts as a bit line. For the purpose of maximum capacitance, the control gate covers the floating gate in as many areas as possible.

Figure 13:
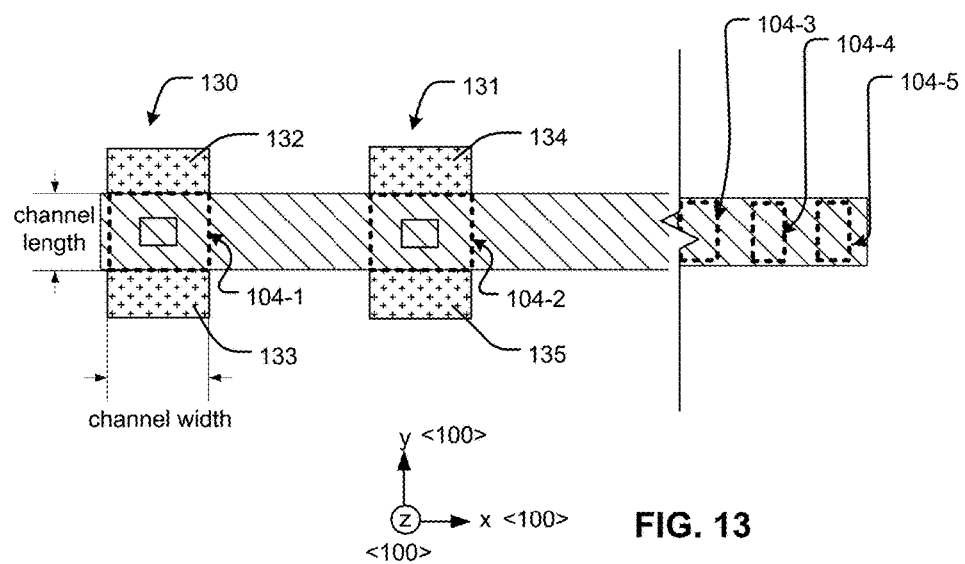

FIG. 13 is a plan view of the structure illustrated in FIG. 12. Referring to FIG. 12, the dotted blocks 104-1, 104-2, 104-3, 104-4 and 104-5 are the overlapping areas between the semiconductor film 104 and the second and third semiconductor films 112, 116. In the peripheral circuit region, transistors 130 and 131 comprise source/drain regions 132, 133, 134 and 135 in the substrate 100 and comprise channels beneath the dotted blocks 104-1, 104-2. The channel length is defined by a distance between the source and drain regions (e.g. 132 and 133) in a <100> lattice direction and the channel width is defined by a distance between adjacent trenches in the second plurality.

The process described with reference to FIGS. 4 to 13 is one example manufacturing sequence in which the alignment of dense patterns of trenches on a direction such as a particular <100> direction can improve process yield and allow for increased process density. Other process flows also benefit from the alignment of trenches as described herein.

A method of manufacturing a semiconductor device described herein comprises providing a substrate having a surface in a (100) lattice plane, wherein a first direction is normal to the (100) lattice plane, and a second direction and a third direction are in the (100) lattice plane and are orthogonal to each other. The first, second, and third directions are equivalents of a <100> lattice direction. The method further comprises forming a first dielectric on the substrate and forming a first semiconductor over the first dielectric, forming a first plurality of trenches into the substrate in memory array regions and a second plurality of trenches into the substrate in peripheral circuit regions, wherein the trenches in the first and second pluralities extend along in <100> lattice direction. The method also comprises filling the trenches in the first and second pluralities with a flowable dielectric material, and forming a first plurality of recesses in the trenches in the first plurality so as to form a first top surface higher than the first dielectric. The method also comprises forming a second plurality of recesses in the trenches in the second plurality so as to form a second top surface higher than the first top surface.

A semiconductor device made according to the process described herein comprises a substrate having a surface in a (100) lattice plane, wherein a first direction is normal to the (100) lattice plane, and a second direction and a third direction are in the (100) lattice plane and are orthogonal to each other. The first, second, and third directions are equivalents of a <100> lattice direction. A first dielectric, for example silicon oxide, is formed over the substrate and a first semiconductor is formed over the first dielectric. A first plurality of isolation structures in the substrate comprises a first insulating material in a first plurality of trenches extending along the <100> lattice direction in dense regions, wherein the first plurality of trenches has a trench width W1. A second plurality of isolation structures in the substrate comprises a second insulating material in a second plurality of trenches extending along the <100> lattice direction in loose regions, wherein the second plurality of trenches has a trench width W2 and the trench width W1 is narrower than the trench width W2. The second insulating material in the second plurality of trenches has a top surface higher than a top surface of the first insulating material in the first plurality of trenches. The top surface of the first insulating material in the first plurality of trenches is higher than a top surface of the first dielectric. In one example, the first insulating material and the second insulating material can comprise the same material.

A semiconductor device made according to the process described herein comprises a substrate having an oxygen concentration ranging from 7 to 10 parts per million atoms (ppma) and a denuded zone substantially greater than 5 μm. A first dielectric, for example a silicon oxide, is formed over the substrate and a first semiconductor is formed over the first dielectric. A first plurality of isolation structures in the substrate comprises a first insulating material in a first plurality of trenches extending along a <100> lattice direction in memory array regions, wherein the first plurality of trenches has a trench width W1. A second plurality of isolation structures in the substrate comprises a second insulating material in a second plurality of trenches extending along the <100> lattice direction in peripheral circuit regions, wherein the second plurality of trenches has a trench width W2 and the trench width W1 is narrower than the trench width W2. The first insulating material in the first plurality of trenches in the memory array regions has a top surface higher than a top surface of the first dielectric. In one example, the first and second insulating materials can comprise the same material.

Figure 14:
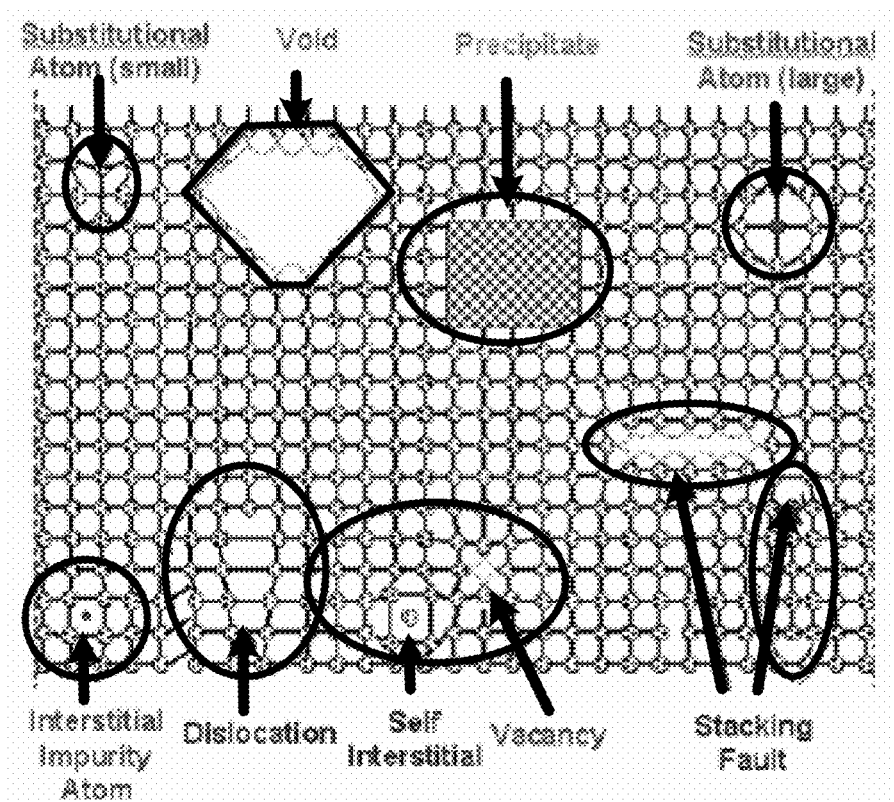
FIG. 14 illustrates various types of defects in a silicon substrate.

FIG. 14 illustrates various types of defects in a silicon substrate. The point defect can include types of vacancy, interstitial and substitutional. The line defect can include the type of dislocation which results from atomic misalignment. The planar defect can include the type of stacking fault which results from irregular stacking of lattice plane. Other defects can include bulk micro defect (BMD), such as oxygen precipitates. The oxygen precipitates results from the segregation of oxygen when the silicon crystal cools and grows from the molten mass, at which oxygen is present in supersaturated concentration.

On one hand, the oxygen precipitates can be good if the size is small because small oxygen clusters can act as thermal donors and reduce resistivity regardless of their locations in the wafer. On the other hand, the oxygen precipitates can damage the operation of the device if the size is large and the location is in the active device region. However, if the large precipitates are located is in bulk silicon, then they can trap unwanted metal impurities, acting as internal or intrinsic getter sites.

A thermal process described herein can be applied to a silicon substrate to control the oxygen concentration. The silicon substrate, such as a <100> wafer or a <110> wafer, is heated at about 700° C. for 3 hours and then at about 1000° C. for 16 hours and the oxygen concentration can decrease to 7~10 parts per million atoms (ppma). After the thermal process, a denuded zone from the surface of the wafer downward to a depth of 5 μm, at least, is formed, in which is a BMD free region. The oxygen precipitates may dissolve and diffuse to dislocations. Then, the oxygen distribution from the wafer surface to 30 um depth is substantially uniform and has an oxygen concentration of about 1E18 $cm^{-3}$, in a range between 5E17 and 2E18 $cm^{-3}$.

Figure 15:
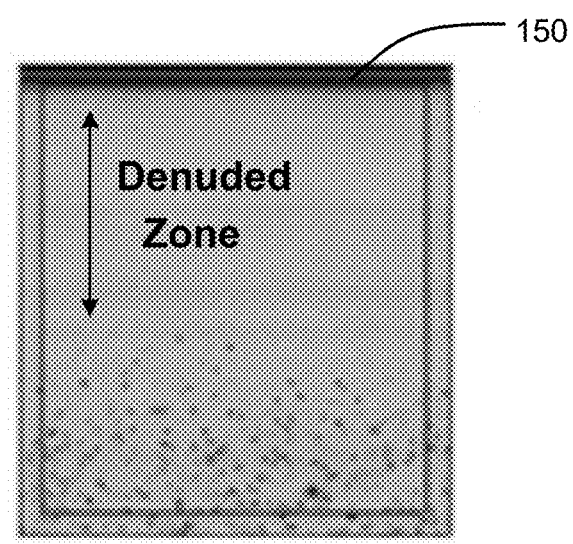
FIG. 15 is an IR tomography image showing the BMD distribution and the denuded zone.

FIG. 15 is an IR tomography image showing the BMD distribution after applying the thermal process described herein. The dark spots shown in the IR tomography image indicate the BMD, and a region below the surface of the wafer 150 without the BMD is the denuded zone. Below the denuded zone, the BMD density is about 1E19 $cm^{-3}$ and the BMD size is less than 50 nm.

Figure 16:
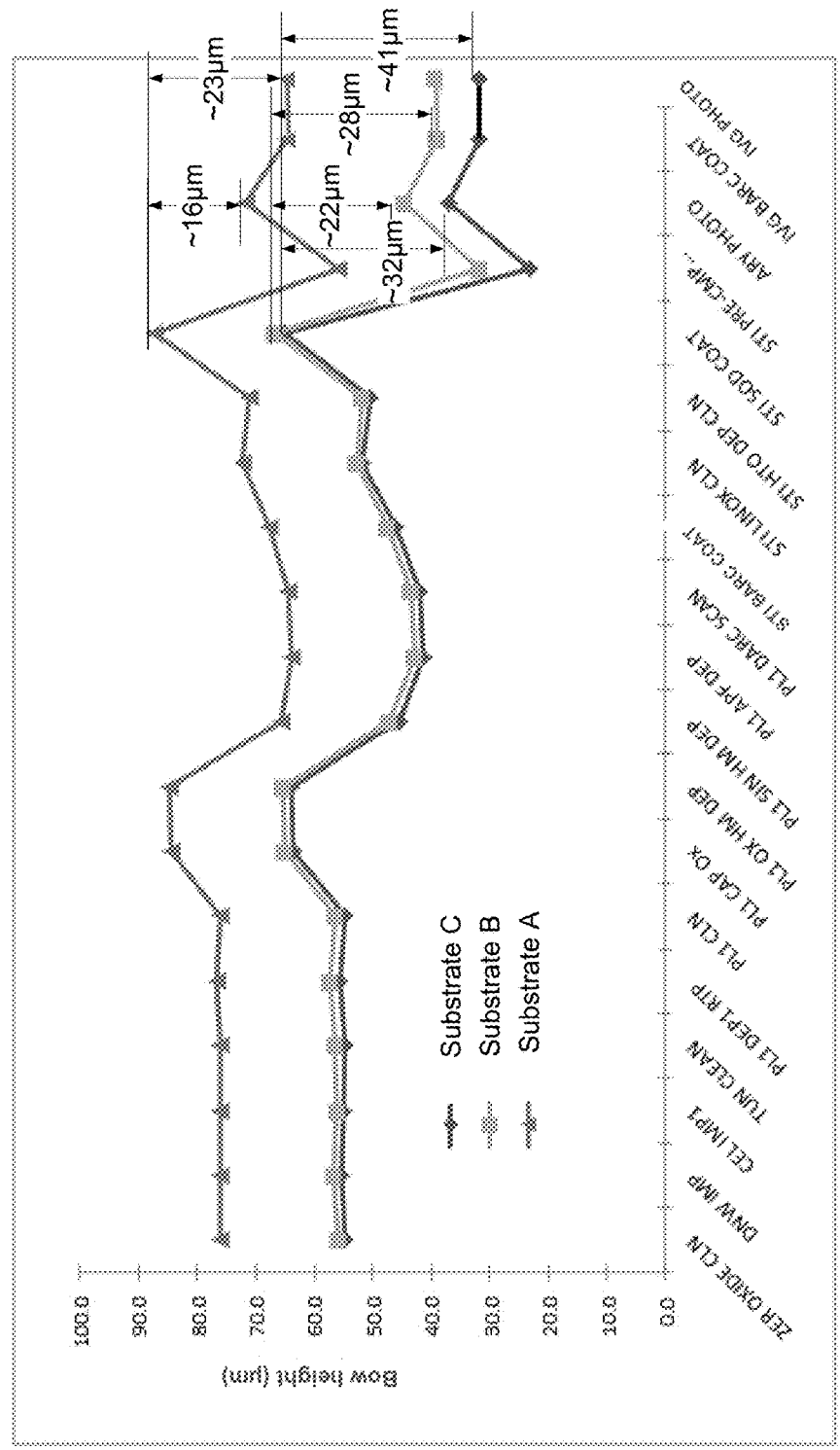
FIG. 16 is a graph illustrating the bow measurement of different silicon substrates A, B, and C, at some process stages in the manufacturing.

FIG. 16 is a graph illustrating the bow height of different silicon substrates A, B, and C at some process stages in the manufacturing. Bow height is referred to the deviation of a median surface of a free, unclaimed substrate from a reference plane. The bow height is not measured at every process stage in the manufacture. The higher bow height indicates the substrate is bended more.

Substrate A is a <100> wafer with a notch oriented in the <100> lattice direction, and the trenches formed in the substrate A extend along the <100> lattice direction. Substrate B is a <110> wafer with a notch oriented in a <110> lattice direction and a thermal process is applied to create the denuded zone as described. The trenches formed in the substrate B extend along the <110> lattice direction. Substrate C is a <110> wafer with a notch oriented in a <110> lattice direction without applying the thermal process. Likewise, the trenches in the substrate C extend along the <110> lattice direction.

Referring to FIG. 16, the bow height changes with the manufacturing process. Before any process is applied, compared to substrates B and C, substrate A has the highest value of initial bow height of about 76 μm, which means the substrate A is bended more than substrates B and C. The bow height is measured after some processes applied, such as deep N-well implant (DNW IMP), tunnel clean (TUN CLEAN), polysilicon deposition RTP (PL1 DEP1 RTP) and polysilicon clean (PL1 CLN) . . . and so on, not measured after every process step. The bow height measured at later process step can represent an accumulated manufacturing residual stress.

As described previously, the film deposited by spin-coating techniques experiences shrinkage and induces severe stress. The SOD for example is utilized in order to fill the high-aspect-ratio trenches, but also causes the bending problem. As the trench size in the peripheral region is greater, so the film shrinkage ratio can be up to 25%, which induces localized deformation which can cause the wafer to bend. As seen in FIG. 16, the fill step (STI SOD COAT) using the SOD may enhance the stress on the substrate and incur the increase in bow. Severe changes in bow height of a substrate can affect the mask-to-mask overlay (also known as REG overlay) and reduce the alignment accuracy. So, the lowest changes in bow height between the stages of STI SOD COAT and the following processes needed to form a mask for patterning is desired and able to have better alignment accuracy. Comparing the bow height between the stages of STI SOD COAT and array photo (ARY PHOTO), substrate A exhibits a 16 μm bow height change, substrate B exhibits a 22 μm bow change, and substrate C exhibits a 32 μm bow change.

Also, it is desired to have the lowest changes in bow height between the stages of STI SOD COAT and IVG PHOTO (as described with reference to FIG. 11). As such the accumulated manufacturing residual stress would not adversely affect mask-to-mask alignment. Comparing the bow height between the stages of STI SOD COAT and IVG PHOTO, substrate A exhibits a 23 μm bow change, substrate B exhibits a 28 μm bow change, and substrate C exhibits a 41 μm bow change.

According to the results, substrate A having the trenches extending along the <100> lattice direction can have a reduced bow change between the stages of STI SOD coat and array photo and between the stages of STI SOD coat and IVG photo. Thus, the following processes required for mask-to-mask alignment can be carried out with better REG overlay.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A semiconductor device comprising:
    a substrate having an oxygen concentration ranging from 7 to 10 parts per million atoms (ppma) and a denuded zone having a depth in the substrate greater than 5 μm;
    a first dielectric formed over the substrate and a first semiconductor formed over the first dielectric;
    a first plurality of isolation structures in the substrate including a first insulating material in a first plurality of trenches extending along a <100> lattice direction in memory array regions, wherein the first plurality of trenches has a trench width W1; and
    a second plurality of isolation structures in the substrate including a second insulating material in a second plurality of trenches extending along the <100> lattice direction in peripheral circuit regions, wherein the second plurality of trenches has a trench width W2 and the trench width W1 is narrower than the trench width W2.

2. The device of claim 1, wherein the first insulating material in the first plurality of trenches in the memory array regions has a top surface higher than the first dielectric.

3. The device of claim 1, wherein the first insulating material and the second insulating material comprise the same material.

4. The device of claim 1, wherein the second insulating material in the second plurality of trenches in the peripheral circuit regions has a top surface higher than a top surface of the first insulating material in the first plurality of trenches in the memory array regions.

5. The device of claim 1, wherein below the denuded zone the substrate has a bulk micro density (BMD) density about $1E19$ $cm^{-3}$.

6. A method of manufacturing an integrated circuit, comprising:
providing a crystalline wafer having an oxygen concentration ranging from 7 to 10 parts per million atoms (ppma) and a denuded zone substantially being beneath a surface of the crystalline wafer greater than 5 µm;
forming a first dielectric formed over the substrate and a first semiconductor formed over the first dielectric;
forming a first plurality of isolation structures in the substrate including a first insulating material in a first plurality of trenches extending along a <100> lattice direction in memory array regions, wherein the first plurality of trenches has a trench width W1; and
forming a second plurality of isolation structures in the substrate including a second insulating material in a second plurality of trenches extending along the <100> lattice direction in peripheral circuit regions, wherein the second plurality of trenches has a trench width W2 and the trench width W1 is narrower than the trench width W2.

7. The method of claim 6, further comprising forming a photoresist layer over a spin coating material wherein said forming the photoresist layer is a mask for patterning the peripheral circuit regions.

8. The method of claim 6, furthering comprising:
forming a composite layer over the trenches in the first and second pluralities;
forming a second semiconductor film on the composite layer;
etching through the composite layer and the second semiconductor film to form a plurality of vias in the peripheral regions; and
forming a third semiconductor film on the second semiconductor film.

9. The method of claim 6, further comprising applying a thermal process to form the denuded region in the wafer.

* * * * *